United States Patent
Matsuo et al.

(10) Patent No.: US 10,424,452 B2
(45) Date of Patent: Sep. 24, 2019

(54) OPERATION COIL DRIVE DEVICE FOR MAGNETIC CONTACTOR

(71) Applicant: FUJI ELECTRIC FA COMPONENTS & SYSTEMS CO., LTD., Tokyo (JP)

(72) Inventors: Naoyuki Matsuo, Hachioji (JP); Takahiro Taguchi, Kounosu (JP); Masahiro Motonobu, Fukaya (JP); Takashi Tsutsumi, Kounosu (JP)

(73) Assignee: FUJI ELECTRIC FA COMPONENTS & SYSTEMS CO., LTD., Tokyo (JP)

( * ) Notice: Subject to any disclaimer, the term of this patent is extended or adjusted under 35 U.S.C. 154(b) by 0 days.

(21) Appl. No.: 15/899,647

(22) Filed: Feb. 20, 2018

(65) Prior Publication Data
US 2018/0174786 A1 Jun. 21, 2018

Related U.S. Application Data

(63) Continuation of application No. PCT/JP2017/002966, filed on Jan. 27, 2017.

(30) Foreign Application Priority Data

Mar. 16, 2016 (JP) .................................. 2016-052535

(51) Int. Cl.
*H01H 47/32* (2006.01)
*H03K 17/64* (2006.01)
*H01F 7/18* (2006.01)
*H01H 47/00* (2006.01)

(52) U.S. Cl.
CPC ......... *H01H 47/325* (2013.01); *H01F 7/1805* (2013.01); *H01F 7/1811* (2013.01); *H01F 7/1844* (2013.01); *H01H 47/00* (2013.01); *H01H 47/32* (2013.01); *H01F 2007/1888* (2013.01); *H03K 17/64* (2013.01)

(58) Field of Classification Search
CPC ...... H01H 47/325; H01H 47/00; H01H 47/32; H01F 7/1805; H01F 7/1844; H01F 2007/1888
(Continued)

(56) References Cited

U.S. PATENT DOCUMENTS 4,473,862 A 9/1984 Hill
4,878,147 A 10/1989 Oyama et al.
(Continued)

FOREIGN PATENT DOCUMENTS

JP 57-78114 5/1982
JP 1-32108 5/1989
(Continued)

OTHER PUBLICATIONS

English Translation by WIPO of the International Preliminary Report on Patentability dated Sep. 27, 2018 in corresponding International Patent Application No. PCT/JP2017/002966, 6 pgs.
(Continued)

*Primary Examiner* — Zeev V Kitov

(57) ABSTRACT

An operation coil drive device includes a drive control unit to perform control to set, for a semiconductor switching element to switch on and off the source voltage applied to an operation coil of a magnetic contactor, a larger ON/OFF time ratio for a circuit-closing control and a smaller ON/OFF time ratio for a holding control, wherein the drive control unit includes: a circuit-closing-control inductance calculation unit to calculate an inductance of the operation coil immediately after a start of the circuit-closing control; a circuit-closing-control resistance value calculation unit to calculate a direct current resistance value of the operation coil based on the calculation result; and a circuit-closing-control switching correction unit to correct the ON/OFF
(Continued)

time ratio of the semiconductor switching element for the circuit-closing control based on the calculation result.

11 Claims, 5 Drawing Sheets

(58) Field of Classification Search
USPC .......................................................... 361/154
See application file for complete search history.

(56) References Cited

U.S. PATENT DOCUMENTS

| | | | |
|---|---|---|---|
| 6,262,874 B1 | 7/2001 | Stoll et al. | |
| 2001/0043450 A1* | 11/2001 | Seale | F01L 9/04 361/160 |
| 2006/0098375 A1 | 5/2006 | Lluch et al. | |

FOREIGN PATENT DOCUMENTS

| | | |
|---|---|---|
| JP | 2005-257669 | 9/2005 |
| JP | 2004-186052 A | 7/2007 |
| JP | 2010-268206 | 11/2010 |
| JP | 2013-12902 | 1/2013 |

OTHER PUBLICATIONS

International Search Report dated Apr. 25, 2017 in corresponding International Patent Application No. PCT/JP2017/002966.
Extended European Search Report dated Feb. 20, 2019 from European Patent Application No. 17766078.4, 9 pages.

* cited by examiner

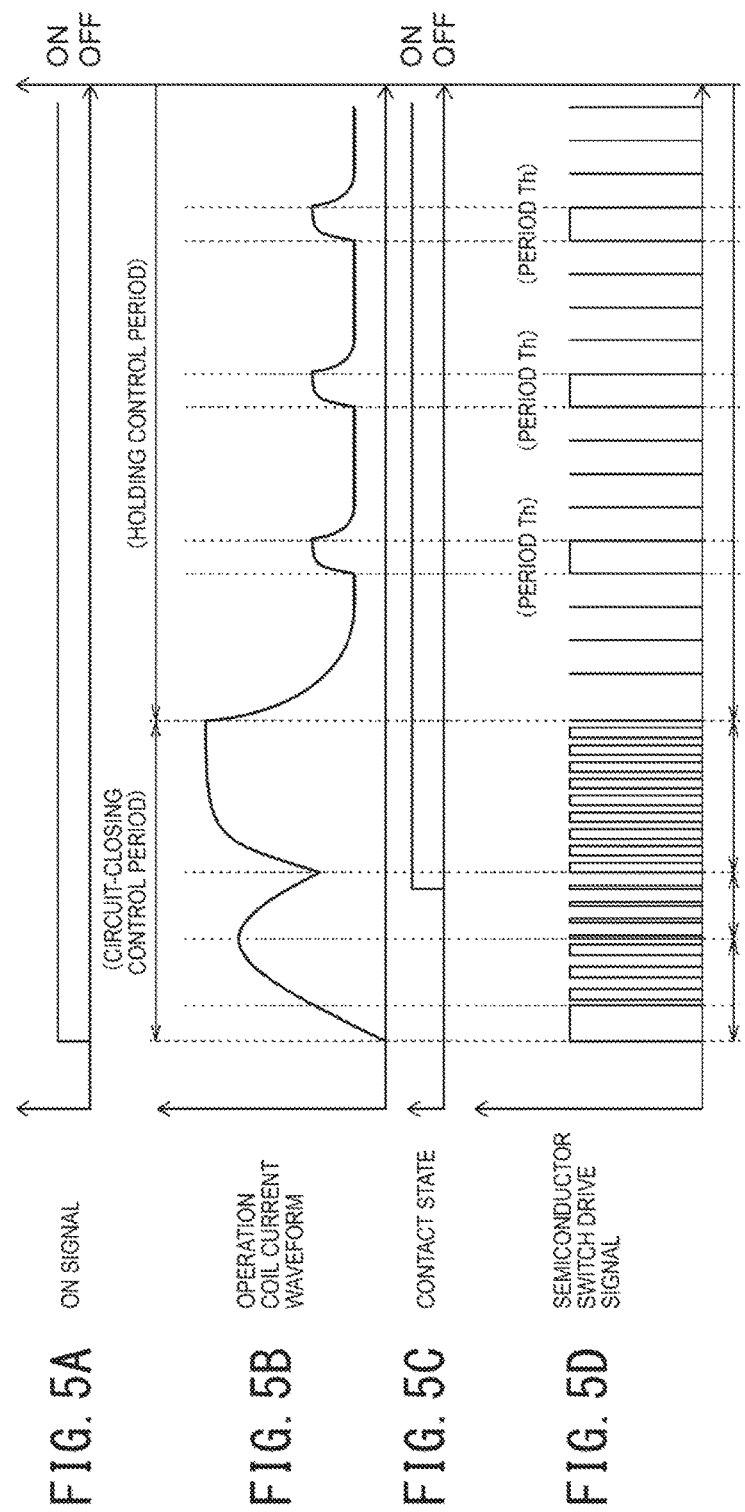

OPERATION COIL DRIVE DEVICE FOR MAGNETIC CONTACTOR

CROSS REFERENCE TO RELATED APPLICATIONS AND INCORPORATION BY REFERENCE

This application is a continuation application filed under 35 U.S.C. § 111(a) of International Patent Application No. PCT/JP2017/002966, filed Jan. 27, 2017, which claims the foreign priority benefit under 35 U.S.C. § 119 of Japanese Patent Application No. 2016-052535, filed Mar. 16, 2016, the contents of which are incorporated herein by reference.

TECHNICAL FIELD

The present invention relates to an operation coil drive device for a magnetic contactor configured to open and close currents supplied to electric load equipment such as an electric motor.

BACKGROUND ART

In a magnetic contactor, electric current is applied to an operation coil forming an electromagnet device to generate in a fixed iron core an attraction force to attract a movable iron core, thereby causing a movable contact to make a contact with or separate from a fixed contact. This enables the opening and closing of a circuit between a single-phase power supply or three-phase power supply and load equipment.

Conventionally, various proposals have been made for a coil drive circuit to be used in a magnetic contactor (see, for example, PTL 1 and PTL 2).

PTL 1 discloses a coil drive device for a magnetic contactor including: a semiconductor switching element to supply source voltage for the operation coil; a voltage detection circuit to detect the source voltage; a gain circuit to output an closing level signal based on the voltage detected by the voltage detection circuit and to output, after a predefined time has expired, a holding level signal based on the detected voltage, the holding level signal being higher than the closing level signal; a reference wave generation circuit to generate a sawtooth wave; a comparator to compare the sawtooth wave generated by the reference wave generation circuit with the closing level signal outputted by the gain circuit to output a closing pulsed signal with a constant period and to compare the sawtooth wave with the holding level signal after a predefined time has expired to output a holding pulsed signal having a smaller ON/OFF time ratio (also called duty ratio) than that of the closing pulsed signal; and a pulse output circuit to supply the closing pulsed signal and the holding pulsed signal for the semiconductor switching element.

In other words, PTL 1 discloses technology for exciting the coil with a large current during the circuit-closing control when a large attraction force is necessary due to a large gap between the iron cores of the electromagnet (in other words, the fixed contact and the movable contact are widely apart) and for minimizing the coil current to reduce the power consumption during the holding control when the contact can be maintained by exciting the operation coil with a relatively small current as the iron cores are attached together with no core gap.

PTL 2 discloses a circuit for controlling an electromagnet comprising a main current control element in series with the electromagnet winding, the main current control element acting initially as a switch to allow "pull-in" current to pass through the operation coil winding and subsequently as a current limiter to limit the current to a lower "hold" level. PTL 2 discloses that the circuit comprises a capacitor having associated diodes and/or switching components for connecting it across the winding once during change over from "pull-in" to "hold" to acquire a reverse charge thereon and again at switch off. As a result the capacitor can discharge in the operation coil winding to provide an electromagnetic force in opposition to the eddy currents sustained in the core after the main current control element is switched off. As a result the capacitor can discharge in the operation coil winding to provide a magnetizing force in a direction different from and in opposition to the magnetizing force of the eddy currents after the main current control element is switched off.

In other words, to shorten the release time of the electromagnet, i.e., the time for releasing the movable contact of the electromagnet from the hold state into the release state, PTL 2 describes technology to decrease the release time of the electromagnet by connecting a capacitor in parallel with the coil to charge the capacitor with the operation coil current after the electromagnet is turned off and allowing the charge to be discharged in the opposite direction to apply a magnetizing force in opposition to that of the electromagnet.

CITATION LIST

Patent Literature

PTL 1: JP H01-132108
PTL 2: JP S57-78114

SUMMARY OF INVENTION

Technical Problem

However, the conventional operation coil drive devices for a magnetic contactor have a problem as follows. Generally, a switching is performed in such a way that a large coil current is applied to the coil to shift the movable iron core from the released state to the attached state during the circuit-closing operation, i.e., when the magnetic contactor shifts from the OFF state to the ON state, and the operation coil current is reduced when the attached state is achieved.

Thus, a large current needs to be applied to the operation coil during the shift to the attached state and the current in the operation coil results in self-heating, which changes the value of the direct current resistance of the operation coil. Since the value of the electric current passing through the operation coil depends not only on the inductance component of the operation coil but also on the direct current resistance of the coil, changes in the direct current resistance of the operation coil due to the self-heating cannot be ignored.

As the operation coil is formed of electric wiring made of a relatively small resistivity material such as enamel copper wire, a drive current large enough to attract the movable iron core can pass through the coil at a low temperature, at which the coil resistance is small but the drive current large enough to attract the movable iron core cannot pass when the coil is used in an environment with a high ambient temperature or the operation coil itself is at a high temperature due to self-heating because the direct current resistance of the operation coil is greater than at a low temperature.

Therefore, magnetic contactors are designed with extra current allowance for the electric current through the operation coil, taking into account the worst conditions of operating temperature that may result from a change in the ambient temperature or self-heating. Thus a current larger than necessary is applied to the operation coil.

Accordingly, noting the above-described disadvantage of the conventional art, an object of the present invention is to provide an operation coil drive device for a magnetic contactor to obtain the operating resistance value of the operation coil without using a temperature detection unit for the operation coil and to provide an appropriate operation coil current under the operating conditions.

Solution to Problem

In order to achieve the object mentioned above, according to an aspect of the present invention, there is provided an operation coil drive device for a magnetic contactor, the device including: a magnetic contactor configured to apply by switching control a source voltage to an operation coil wound around a fixed iron core to attract a movable iron core;

a current detection unit configured to detect a current allowed to pass by the switching control through the operation coil; a coil voltage detection unit configured to detect a voltage across the operation coil during the switching control; and a drive control unit configured to perform control to set, for a semiconductor switching element to switch on and off the source voltage applied to the operation coil, a larger ON/OFF time ratio for a circuit-closing control and a smaller ON/OFF time ratio for a holding control. The drive control unit includes: a circuit-closing-control inductance calculation unit configured to calculate an inductance of the operation coil at a sampling timing of a coil current passing through the operation coil immediately after a start of the circuit-closing control; a circuit-closing-control resistance value calculation unit configured to calculate a direct current resistance value of the operation coil based on a result of calculation by the circuit-closing-control inductance calculation unit; and a circuit-closing-control switching correction unit configured to correct the ON/OFF time ratio of the semiconductor switching element for the circuit-closing control based on a result of calculation by the circuit-closing-control resistance value calculation unit.

Advantageous Effects of Invention

According to an aspect of the present invention, for an operation coil wound around a fixed iron core to attract a movable iron core, an optimal control of the coil current is performed to ensure the reliable operation of attracting the movable iron core and to achieve the reliable operation of the magnetic contactor.

BRIEF DESCRIPTION OF DRAWINGS

FIGS. 5A to 5D are diagrams of signal waveforms illustrating an operation of the operation coil drive device in FIG. 3.

DESCRIPTION OF EMBODIMENTS

Next, with reference to the accompanying drawings, an embodiment according to the present invention will be described.

In the following description of the drawings, the same or similar reference signs are assigned to the same or similar composing elements. However, it should be noted that the drawings are schematic and relations between thicknesses and planar dimensions, ratios among thicknesses of respective layers, and the like are different from actual ones. Therefore, specific thicknesses and dimensions should be determined in consideration of the following description. It should also be noted that the drawings include portions having different dimensional relationships and ratios from each other.

In addition, the embodiment, which will be described below, indicate devices and methods to embody the technical idea of the present invention, and the technical idea of the present invention does not limit the materials, shapes, structures, arrangements, and the like of the constituent components to those described below. The technical idea of the present invention can be subjected to a variety of alterations within the technical scope prescribed by the claims.

Hereinafter, an aspect of an operation coil drive device for a magnetic contactor according to a first embodiment of the present invention will be described.

Figure 1:
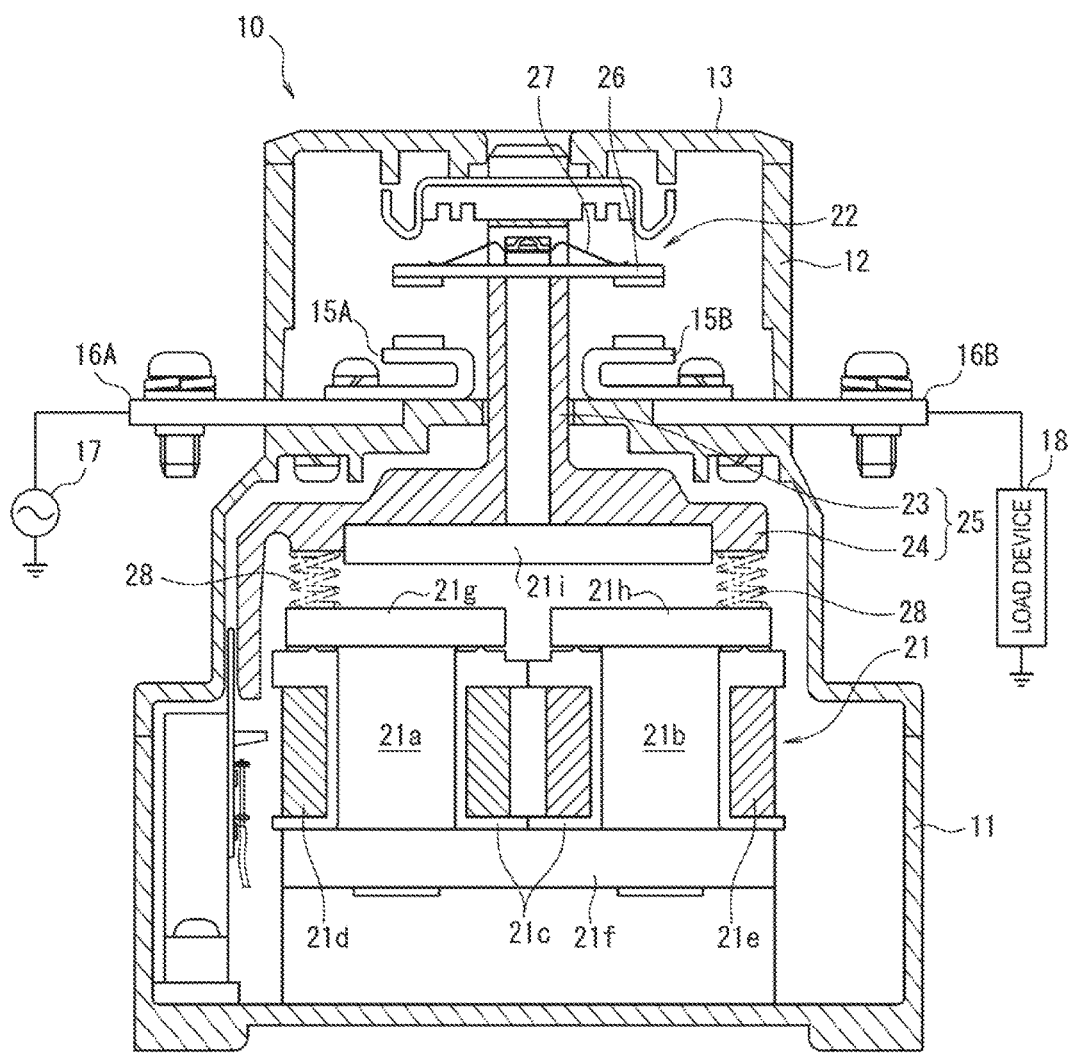
FIG. 1 is a cross-sectional view illustrating an example of a magnetic contactor in an open state to which the present invention may be applied.

First of all, a magnetic contactor 10 to which the present invention may be applied includes a lower housing 11 made of insulating material, an upper housing 12 made of insulating material and attached to the top portion of the lower housing 11, and an arc suppression cover 13 made of insulating material and attached in such a manner as to cover an upper opening of the upper housing 12, as illustrated in FIG. 1.

To an intermediate wall of the upper housing 12 are fixed a pair of fixed contacts 15A, 15B, one on the right and one on the left with a certain interval between them and a pair of terminal plates 16A, 16B, one on the right and one on the left with a certain interval between them.

The fixed contact 15A and the terminal plate 16A are connected to an external power supply 17 while the fixed contact 15B and the terminal plate 16B are connected to a load device 18 such as an inverter to drive electric equipment such as an electric motor.

An electromagnet device 21 is accommodated in a hollow part defined by the lower housing 11 and a lower space of the hollow part beneath the intermediate wall of the upper housing 12. The electromagnet device 21 includes a pair of fixed iron cores 21a, 21b, one on the right and one on the left, an operation coil 21d wound around a coil holder 21c surrounding one of the fixed iron cores 21a, an operation coil 21e wound around a coil holder 21c surrounding the other of the fixed iron cores 21b, a yoke 21f abutting lower end surfaces of the pair of fixed iron cores 21a, 21b, magnetic pole plates 21g, 21h abutting upper end surfaces of the fixed iron cores 21a, 21b, and a movable iron core 21i disposed opposite to the magnetic pole plates 21g, 21h.

A movable contact mechanism 22 is accommodated in an inner space stretching on both sides of the intermediate wall of the upper housing 12.

The movable contact mechanism 22 includes: a movable contact holder 25 movable in the upward and downward directions, the movable contact holder 25 including a contact support 23 and a connecting member 24 for firmly holding a movable iron core 21i of the electromagnet device 21, a movable contact 26 formed in a plate shape, connected to an upper portion of the movable contact holder 25 and confronting the fixed contacts 15A and 15B from above; a contact pressure spring 27 connected with an upper portion of the contact support 23 to give the movable contact 26 a downward bias by the power of spring; and a plurality of return springs 28 disposed between the magnetic pole plates 21g, 21h and the connecting member 24 to give the movable iron core 21i a bias away from the fixed iron cores 21a, 21b.

When the magnetic contactor 10, constituted as described above, is in the open state, in which the movable contact 26 is separated upward from the fixed contacts 15A and 15B as illustrated in FIG. 1, and an electric current is applied through the operation coils 21d, 21e of the fixed iron cores 21a, 21b, a strong magnetic flux is generated due to the magnetic permeability of the fixed iron cores 21a, 21b. The strong magnetic flux generated in the fixed iron cores 21a, 21b produces an attraction force for the fixed iron cores 21a, 21b to attract the movable iron core 21i. The attraction force is proportionate to the product of the coil current passing through the operation coils 21d, 21e multiplied by the number of turns of wire wound around the operation coils 21d, 21e.

Figure 2:
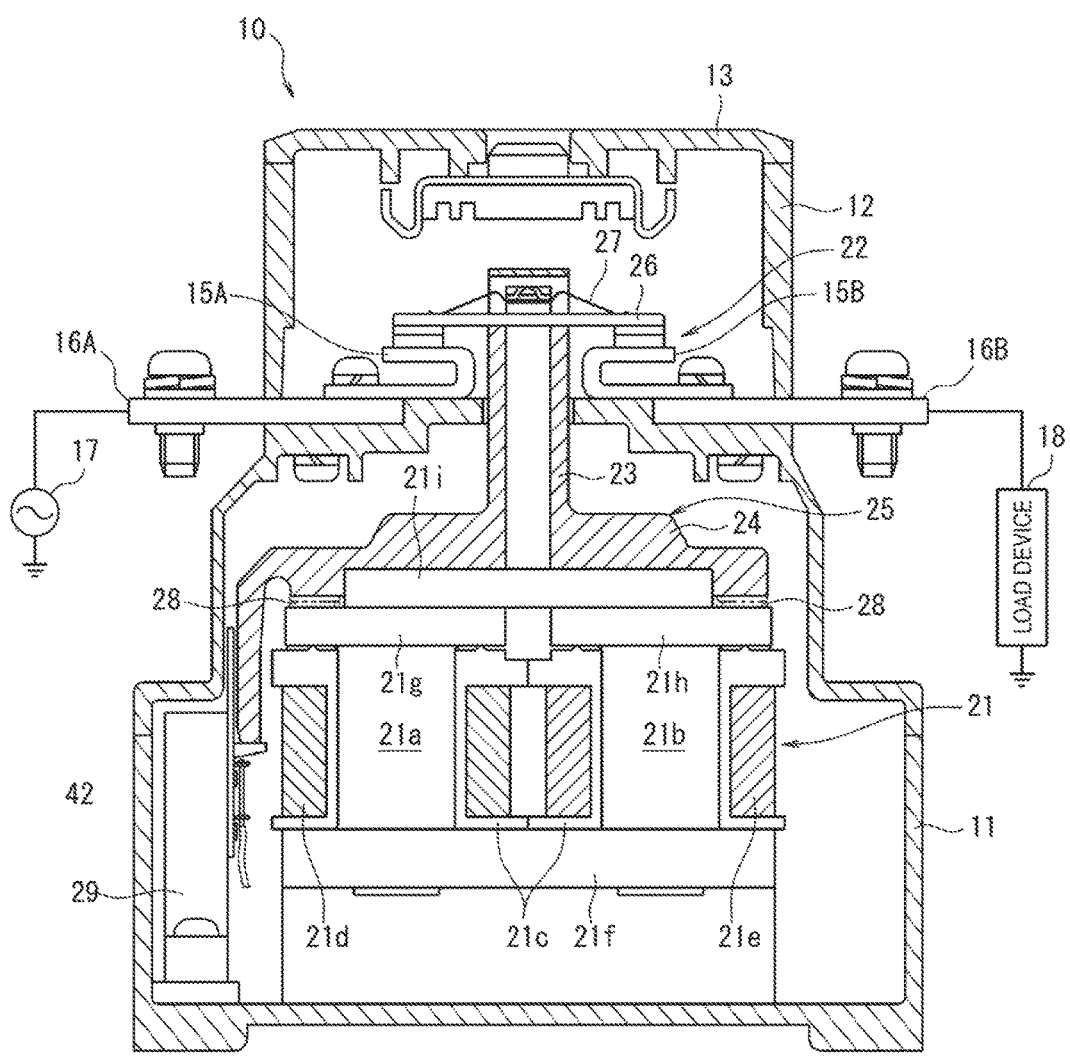
FIG. 2 is a cross-sectional view illustrating an example of a magnetic contactor in a closed state to which the present invention may be applied.

After a lapse of a certain time after the operation coils 21d, 21e starts to be driven, the attraction force produced in the fixed iron cores 21a, 21b attracts the movable iron core 21i downward and, as illustrated in FIG. 2, the movable contact 26 comes into contact with the fixed contacts 15A and 15B at a contact pressure provided by the contact pressure spring 27. Thus, the magnetic contactor 10 comes into the closed state and the external power supply 17 supplies power to the load device 18.

Figure 3:
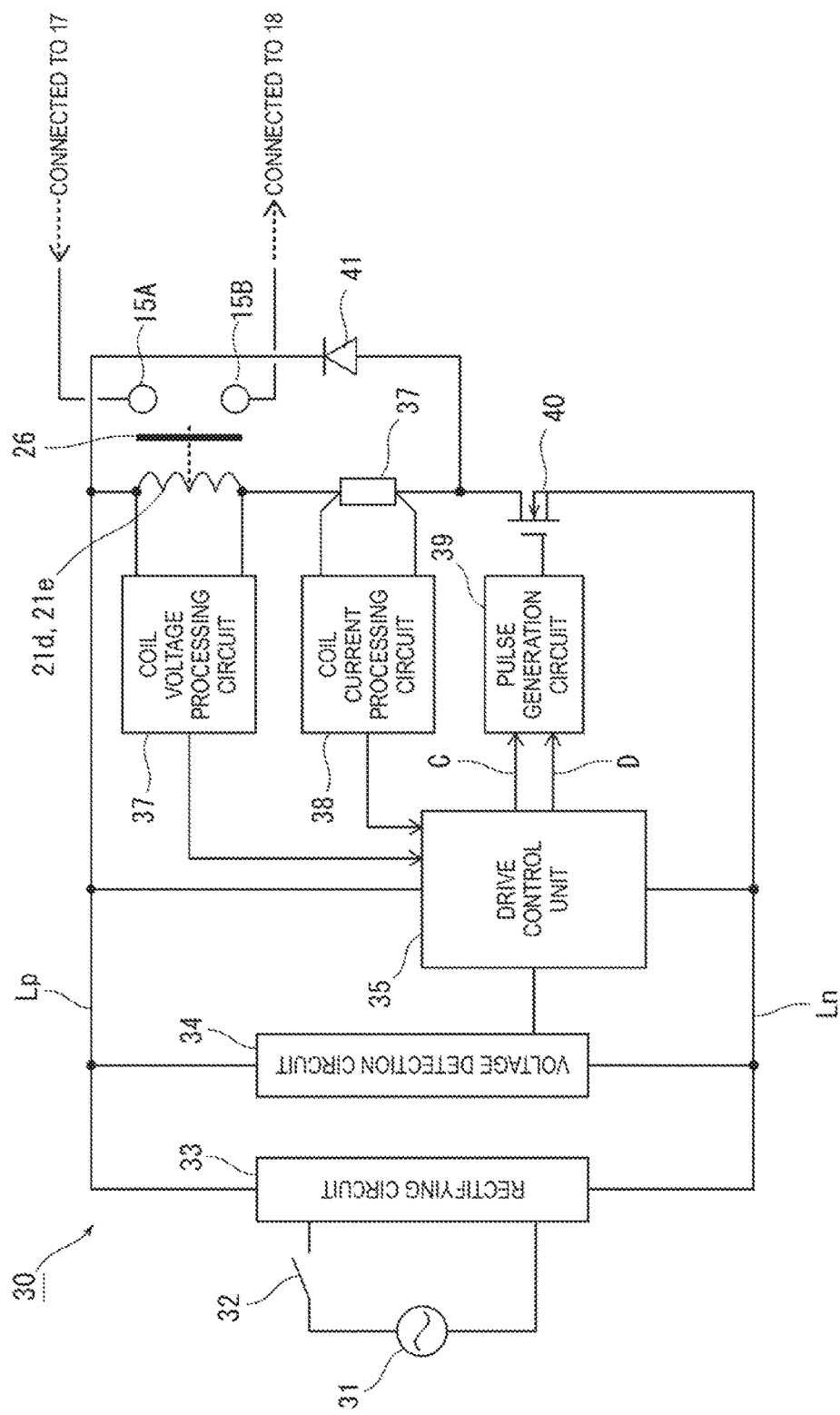
FIG. 3 is a block diagram illustrating an operation coil drive device.

The magnetic contactor 10 also has a built-in operation coil drive device 30 as illustrated in FIG. 3 to allow current to pass through the operation coils 21d and 21e.

The operation coil drive device 30 includes a rectifying circuit 33, connected via an operation switch 32 to a coil power supply 31, which is a single-phase AC power or a three-phase AC power. The operation switch 32 is controlled by an external switching signal to control the magnetic contactor 10 between the ON state (closed state) and the OFF state (open state). The rectifying circuit 33 includes rectifying diodes, the number of which is determined according to the type of the coil power supply 31, and other components and supplies DC voltage obtained by rectifying the AC voltage to the circuits described below via the positive line Lp and the negative line Ln.

The operation coil drive device 30 also includes an input voltage detection circuit 34 and a drive control unit 35 in parallel connection between the positive line Lp and the negative line Ln of the rectifying circuit 33. The input voltage detection circuit 34 detects an output voltage of the rectifying circuit 33 by, for example, voltage dividing means using a resistance element and supplies the detected voltage to the drive control unit 35. The drive control unit 35 includes an arithmetic processing circuit 35a such as, for example, a microprocessor. The operation power for the drive control unit 35 is directly supplied by the output voltage of the rectifying circuit 33 but, when the output voltage of the rectifying circuit 33 is high, the operation power is supplied by a low-voltage power source made available by, for example, a voltage regulator circuit or the like.

The operation coil drive device 30 further includes a current detection resistance element 36 and a semiconductor switching element 40, which are in series connection with the operation coils 21d and 21e of the magnetic contactor 10, which are in series connection between the positive line Lp and negative line Ln of the rectifying circuit 33. In other words, one end of the operation coils 21d, 21e, which are in series connection, is connected with the positive line Lp of the rectifying circuit 33 while the other end of the operation coils 21d, 21e is connected with an end of the current detection resistance element 36.

The other end of the current detection resistance element 36 is connected with the electrode on the high potential side of the semiconductor switching element 40. The electrode on the low potential side of the semiconductor switching element 40 is connected with the negative line Ln of the rectifying circuit 33.

The operation coil drive device 30 includes a coil voltage processing circuit 37 serving as a voltage detection unit and connected between both ends of the operation coils 21d, 21e, a coil current processing circuit 38 serving as a current detection unit and connected between both ends of the current detection resistance element 36, and a pulse generation circuit 39 connected with the control electrode of the semiconductor switching element 40. The output of the coil voltage processing circuit 37 is inputted to the drive control unit 35 and the output of the coil current processing circuit 38 is also inputted to the drive control unit 35. The outputs of the drive control unit 35 (closing control signal C, holding control signal D) are inputted to the pulse generation circuit 39.

Further, the series circuit consisting of the operation coils 21d, 21e and the current detection resistance element 36 is connected in parallel with a diode element 41 constituting a freewheeling circuit.

The operation coil drive device 30, constituted as described above, is a circuit to properly control the coil current supplied to the operation coils 21d, 21e of the electromagnet device 21.

The operation coil drive device 30, generally, drives the operation coils 21d, 21e to attract the movable iron core 21i into attachment with the fixed iron cores 21a, 21b and further drives the operation coils 21d, 21e to retain the attached state.

The control performed to attract the movable iron core 21i into attachment with the fixed iron cores 21a, 21b will be referred to as circuit-closing control and the control performed to retain the subsequent attached state will be referred to as holding control. The control performed to release the movable iron core 21i away from the fixed iron cores 21a, 21b will be referred to as circuit-opening control.

The semiconductor switching element 40 may be, for example, a MOS-FET (metal oxide semiconductor-field effect transistor), a bipolar transistor, or the like and, in the case of n-type MOS-FET, the control electrode of the semiconductor switching element 40 corresponds to the gate terminal, the electrode on the high potential side corresponds to the drain terminal, and the electrode on the low potential side corresponds to the source terminal.

The semiconductor switching element 40 switches on and off the output DC voltage of the rectifying circuit 33 according to the ON/OFF signal from the pulse generation circuit 39. This allows coil current to pass through the operation coils 21d, 21e. At this time, across the operation coils 21d, 21e a voltage is produced equal to the output voltage of the rectifying circuit 33 minus the voltage across the current detection resistance element 36 and the saturation voltage of the semiconductor switching element 20. This voltage across the operation coils 21d, 21e is inputted to the coil voltage processing circuit 37.

It should be noted that, generally, for the semiconductor switching element 40, an element with a saturation voltage sufficiently smaller than the output voltage of the rectifying circuit 33 is selected. This prevents the semiconductor switching element from being damaged due to the package thermal resistance of the element. Further, for the current detection resistance element 36, which needs to withstand a large current passing through the operation coils 21d, 21e during the closing-pulse period, a resistance value is selected to make (Resistance)·(Current)$^2$ very small, taking into consideration the package heat resistant temperature of the current detection resistance element 36. Further, a resistance value is selected to make the voltage across the current detection resistance element 36 sufficiently smaller than the output voltage of the rectifying circuit 33.

The semiconductor switching element 40 switches on and off the output DC voltage of the rectifying circuit 33 according to the ON/OFF signal from the pulse generation circuit 39. This allows coil current to pass through the operation coils 21d, 21e. The intensity of the coil current is determined by the source voltage, the resistance value and the inductance value of the operation coils 21d, 21e, and the ON-time of the semiconductor switching element 40. The current detection resistance element 36 detects the coil current passing through the operation coils 21d, 21e and outputs the detected current to the coil current processing circuit 38.

Figure 4:
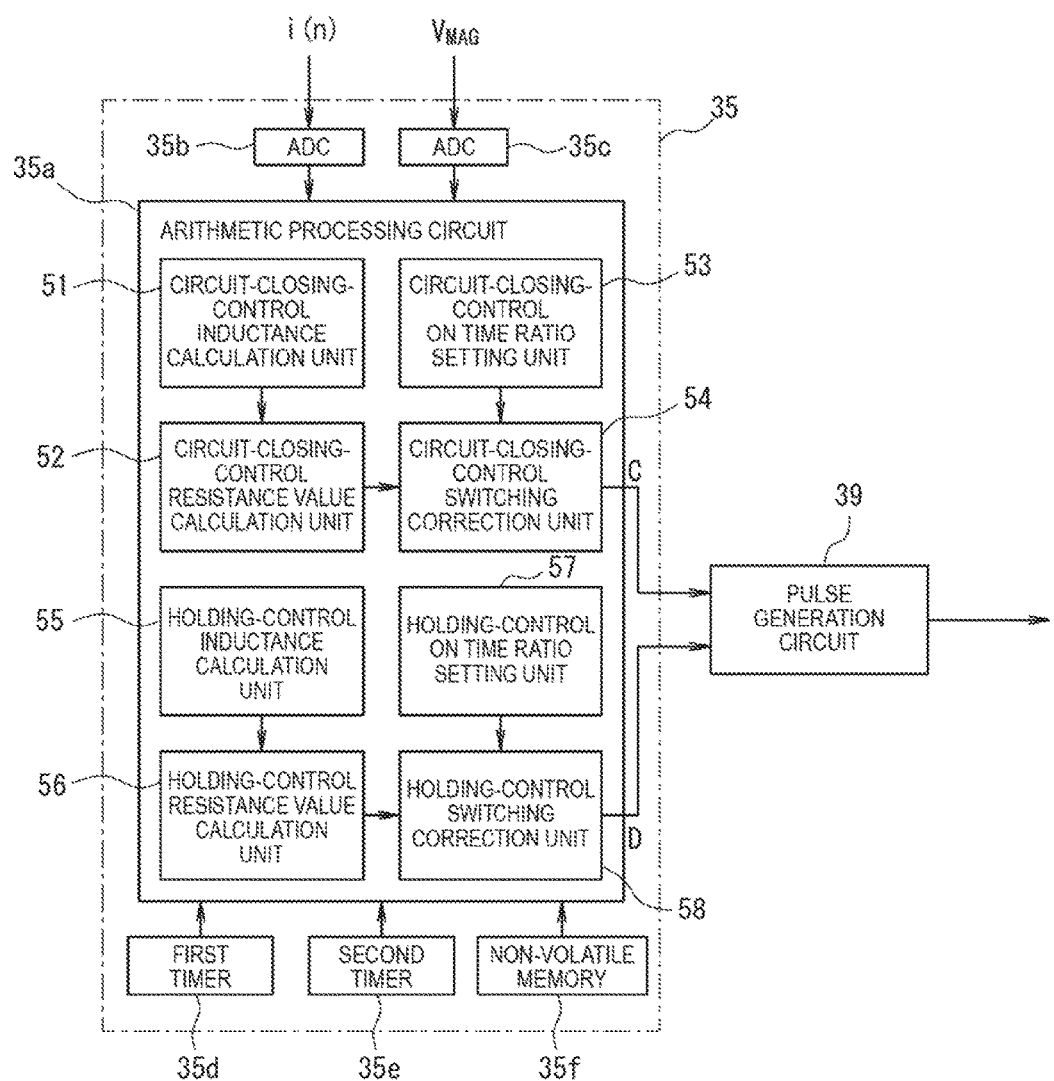
FIG. 4 is a block diagram illustrating a specific configuration of the drive control unit in FIG. 3.

The drive control unit 35 performs the circuit-closing control to attract the movable iron core 21i into attachment with the fixed iron cores 21a, 21b and the holding control to retain the subsequent attached state. In a concrete configuration, the drive control unit 35 includes an on-board arithmetic processing circuit 35a, which includes, for example, a microprocessor as illustrated in FIG. 4, to accurately measure fluctuation factors apart from the source voltage, such as the scattering of resistance values of the operation coils 21d, 21e and changes in the resistance of the operation coils caused by coil temperature increases. The drive control unit 35 also includes on board at least two analogue-digital converters (to be written as ADCs hereafter) 35b, 35c. The drive control unit 35 further includes on board at least two timers, i.e., a first timer 35d and a second timer 35e to allow the arithmetic processing circuit 35a and the pulse generation circuit 39 to have a pulse width modulation (PWM) control function. The first timer 35d is used as a timer to determine a PWM period and, speaking of the PWM period, a frequency over ten and several KHz and out of the audio-frequency range is preferable.

The second timer 35e is used for determining the time to turn on the semiconductor switching element 40 to excite the operation coils 21d, 21e. In this case, for the circuit-closing control, the first timer 35d determines the time during which to excite the operation coils 21d, 21e (or the duty ratio) relative to a predetermined PWM period, setting a long time for the circuit-closing control and a short time for the holding control.

In other words, according to the present embodiment, as illustrated in FIG. 5D, a period Ts of a certain duration during which the operation coils 21d, 21e are excited is set immediately after the start of the circuit-closing control of the operation coils 21d, 21e and a period Th of a certain duration during which the operation coils 21d, 21e are excited is set at a certain cycle during the holding control. During these periods Ts and Th thus set, the operation coil voltage applied across the operation coils 21d, 21e is fed, via the coil voltage processing circuit 37, to the drive control unit 35. Further, the coil current passing through the operation coils 21d, 21e is converted to a voltage signal by the current detection resistance element 36 and, via the coil current processing circuit 38, is fed to the drive control unit 35. The output signal of the coil voltage processing circuit 37 is fed to one of the ADCs 35b provided on board for the drive control unit 35 to be converted to digital data.

The output signal of the coil current processing circuit 38 is fed to the other one of the ADCs 35c provided on board for the drive control unit 35 to be converted to digital data.

In a concrete configuration, the arithmetic processing circuit 35a includes, as illustrated in FIG. 4, a circuit-closing-control inductance calculation unit 51, a circuit-closing-control resistance value calculation unit 52, a circuit-closing-control ON time ratio setting unit 53, and a circuit-closing-control switching correction unit 54 to perform the circuit-closing control.

The arithmetic processing circuit 35a also includes a holding-control inductance calculation unit 55, a holding-control resistance value calculation unit 56, a holding-control ON time ratio setting unit 57, and a holding-control switching correction unit 58 to perform the holding control.

The circuit-closing-control inductance calculation unit 51 computes the circuit-closing-control inductance $L_{MAG}$ at the start of the circuit-closing control.

As illustrated in FIG. 5, the circuit-closing control is started when the operation switch 32 turns into the ON state as illustrated in FIG. 5A. For a certain period Ts immediately after the start of the circuit-closing control, the duty ratio of the PWM period, which is over ten and several KHz and out of the audio-frequency range, is set at 100%. This increases the current passing through the operation coils 21d, 21e as illustrated in FIG. 5B and, after the certain period Ts has expired, the duty ratio is decreased, for example, to 50% to gradually increase the current passing through the operation coils 21d, 21e. Subsequently when the fixed iron cores 21a, 21b attract the movable iron core 21i and the movable contact 26 starts to move toward the fixed contacts 15A, 15B, the duty ratio is further decreased to decrease the current passing through the operation coils 21d, 21e. Subsequently, when the movable contact 26 comes into contact with the fixed contacts 15A, 15B and the magnetic contactor 10 turns into the ON state as illustrated in FIG. 5C, the duty ratio is increased to about 50% again as illustrated in FIG. 5D to increase the current passing through the operation coils 21d, 21e to a peak current level.

When the current passing through the operation coils 21d, 21e reaches the peak current level, the circuit-closing control period terminates and the holding control period, which will be described later, starts.

For the certain period Ts immediately after the start of the circuit-closing control, the operation coils 21d, 21e are charged with the current i(n) in the following equation as the duty ratio is 100%, where ΔT is the PWM period.

In other words, the charging current i(n) with which the operation coils 21d, 21e are charged during the circuit-closing control period is expressed by the following equation (1).

[Formula 1]

$$i(n) = \frac{V_{MAG}}{R_{MAG} + R_S} \times \left[1 - \exp\left(-\frac{R_{MAG} + R_S}{L_{MAG}} \times n \times \Delta T\right)\right] \quad (1)$$

n=0, 1, 2 . . . .
The variables in the equation (1) above are represented as follows.
i: charging current of the operation coils 21d, 21e
$V_{MAG}$: charging voltage of the operation coils 21d, 21e
$L_{MAG}$: circuit-closing-control inductance of the operation coils 21d, 21e
$R_{MAG}$: circuit-closing-control direct current resistance value of the operation coils 21d, 21e
$R_S$: current detection resistance value
$\Delta T$: sampling time To simplify internal arithmetic in the arithmetic processing circuit 35a, a following approximation can be made by applying Fourier series expansion to the exponential function part in the equation (1). When n=1, the current i(1) through the operation coils 21d, 21e is:

[Formula 2]

$$i(1) \approx \frac{V_{MAG}}{L_{MAG}} \times \Delta T \quad (2)$$

Herein i(1) is measured by the coil current processing circuit 38 and $V_{MAG}$ is measured by the coil voltage processing circuit 37. $\Delta T$ is a predefined sampling time, i.e., the PWM period. Hence the circuit-closing-control inductance calculation unit 51 performs a calculation according to the equation (2) to calculate the circuit-closing-control inductance $L_{MAG}$.

Further, the circuit-closing-control resistance value calculation unit 52 calculates the circuit-closing-control resistance value $R_{MAG}$ based on the circuit-closing-control inductance $L_{MAG}$ calculated by the circuit-closing-control inductance calculation unit 51.

In other words, by applying Fourier series expansion to the exponential function part in the afore-mentioned equation (1), the current passing through the operation coils 21d, 21e is expressed as in the following equation.

[Formula 3]

$$i(n) = \frac{V_{MAG}}{L_{MAG}} \times n \times \Delta T \times \left[1 - \frac{1}{2!} \times \frac{R_{MAG} + R_S}{L_{MAG}} \times n \times \Delta T + \ldots\right] \quad (3)$$

From the equation (2) and the equation (3), the following equation is obtained.

[Formula 4]

$$i(n) \approx n \times i(1) \times \left[1 - \frac{1}{2!} \times \frac{R_{MAG} + R_S}{L_{MAG}} \times n \times \Delta T\right] \quad (4)$$

Compared with the direct current resistance value $R_{MAG}$ of the operation coils 21d, 21e, the current detection resistance value $R_S$ in actual use is:

$$R_{MAG} >> R_S \quad (5)$$

and by substituting $R_S \approx 0$ in the equation (4) a direct current resistance value $R_{MAG}$ can be calculated for an appropriate n. Therefore, the circuit-closing-control resistance value calculation unit 52 can calculate a circuit-closing-control direct current resistance value $R_{MAG}$ by performing a calculation according to the equation (4) by substituting $R_S \approx 0$ in the equation (4) and substituting i(n) with the coil current measured by the coil current processing circuit 38, n with the number of times of processing, i(1) with the current passing through the operation coils 21d, 21e when n=1, $L_{MAG}$ with the circuit-closing-control inductance, and $\Delta T$ with the PWM period.

Description will now be made as to the control in the case in which the circuit-closing control period has terminated, the holding control period has started and a period Th of a certain duration during which the operation coils 21d, 21e are excited is set at a certain cycle during the holding control.

During the holding control, the contactor unit, i.e., the contact unit of the magnetic contactor 10 has a narrowed spatial gap between the fixed iron cores 21a, 21b and the movable iron core 21i as illustrated in FIG. 2, and hence the inductance of the operation coils 21d, 21e is increased to a holding-control inductance $L'_{MAG}$ from the afore-mentioned circuit-closing-control inductance $L_{MAG}$.

Accordingly, the holding-control inductance calculation unit 55 calculates the holding-control inductance $L'_{MAG}$.

In other words, utilizing the afore-mentioned equation (2), the current in the holding control mode is expressed as in the equation (6).

[Formula 5]

$$i(1) - i(h) \approx \frac{V_{MAG}}{L'_{MAG}} \times \Delta T \quad (6)$$

Herein, i(1) is measured by the coil current processing circuit 38 and $V_{MAG}$ is measured by the coil voltage processing circuit 37. i(h) is a setting current set in advance for determining the current passing through the operation coils 21d, 21e during the holding control. $\Delta T$ is a predefined sampling time, i.e., the PWM period.

Thus, the holding-control inductance calculation unit 55 calculates the inductance $L'_{MAG}$ of the operation coils 21d, 21e during the holding control by performing a calculation, substituting values for i(1), i(h), $V_{MAG}$, and $\Delta T$ in the equation (6).

The holding-control resistance value calculation unit 56 calculates the holding-control resistance value $R_{MAG}$ by performing a calculation according to the equation (7) below based on the afore-mentioned equation (3).

In other words, the equation (7) below is obtained from the current corresponding to the afore-mentioned equation (3) obtained by applying Fourier series expansion to the exponential function part of the afore-mentioned equation (1) and the current of the afore-mentioned (6).

[Formula 6]

$$i(1) - i(h) \approx n \times (i(1) - i(h)) \times \left[1 - \frac{1}{2!} \times \frac{R_{MAG} + R_S}{L'_{MAG}} \times n \times \Delta T\right] \quad (7)$$

The current detection resistance value $R_S$ in actual use is sufficiently smaller than the direct current resistance $R_{MAG}$ of the operation coils 21d, 21e and by applying the equation (5) and substituting $R_S \approx 0$ in the equation (7), the holding-control direct current resistance value $R_{MAG}$ can be calculated for an appropriate n.

Thus, the holding-control resistance value calculation unit 56 can calculate the holding-control direct current resistance value $R_{MAG}$ by performing a calculation by substituting $R_S \approx 0$ in the equation (7) and, in this equation (7), substituting i(n) with the coil current measured by the coil current processing circuit 38, i(h) with the setting current, n with the number of times of processing, i(1) with the current passing through the operation coils 21d, 21e when n=1, $L'_{MAG}$ with the holding-control inductance, and $\Delta T$ with the PWM period.

As described above, irrespective of whether the movable contact 26 of the magnetic contactor is in the released state or in the contact state, the inductance $L_{MAG}$ and the direct current resistance value $R_{MAG}$ of the operation coils 21d, 21e at the start of the closing of the circuit during the circuit-closing control can be obtained by a control circuit 15 from the result of measurement in one sampling and the result of measurement in n samplings.

In addition, it is possible to equip the drive control unit 35 with a sequence for obtaining at a certain cycle during the holding control the inductance $L'_{MAG}$ and the direct current resistance value $R_{MAG}$ of the operation coils 21d, 21e.

Thus, for example, by storing the inductance and the direct current resistance value of the operation coils at the start of the closing of the circuit during the circuit-closing control of the magnetic contactor at factory shipment in a non-volatile memory 35f connected with the arithmetic processing circuit 35a provided on board in the drive control unit 35, the inductance and the direct current resistance value of the operation coils 21d, 21e during the circuit-closing control and during the holding control can be obtained by a calculation even when the magnetic contactor 10 is in a normal operation state after the shipment.

When, for example, enameled copper wire is used for wiring the operation coils 21d, 21e, the temperature coefficient $\alpha$ of the material used for the copper wire is as follows.

[Formula 7]

$$\alpha = 0.004 K^{-4} \quad (8)$$

Therefore, based on the direct current resistance value of the operation coils 21d, 21e at factory shipment and the direct current resistance value of the operation coils 21d, 21e in the current operation state, the change in the resistance value in the current operation state as compared with the resistance value at the factory shipment can be calculated according to (9) below, wherein $\Delta Tmp$ is the temperature change in the operation state from the time of factory shipment.

[Formula 8]

$$\alpha \times \Delta T_{mp} = \frac{\Delta R}{R_{init}} \quad (9)$$

Herein, the variables are represented as follows.
$\Delta R$: (the direct current resistance value of the operation coils in the operation state)−(the direct current resistance value of the operation coils at factory shipment)
$R_{init}$: the direct current resistance value of the operation coils at factory shipment When the operation signal from the drive control unit 35 is at "H" level (ON state), the pulse generation circuit 39 outputs an ON/OFF signal for the circuit-closing control to the semiconductor switching element 40 within the period in which the closing control signal C is at "H" level and outputs an ON/OFF signal for the holding control to the semiconductor switching element 40 within the period in which the holding control signal D is at "H" level.

According to the present embodiment, the ON time ratio of the ON/OFF signal for the circuit-closing control is greater than the ON time ratio of the ON/OFF signal for the holding control, as illustrated in FIG. 5D. Further, the ON time ratio for the circuit-closing control has an established ON time ratio pattern during this period. Still further, the ON time ratio for the holding control is set at a fixed ratio at factory shipment.

However, when the magnetic contactor is in the operation state, the above-described operation temperature environment is different from the environment at factory shipment. This is due to the effects of a change in the ambient temperature during the operation state and a change in the temperature of the operation coils by self-heating resulting from the operation of the magnetic contactor. The magnetic contactor is affected by the temperature change as expressed in the equation (9) due to the effects by the temperature change of the operation coils 21d, 21e.

Therefore, the ON time ratio for the circuit-closing control, which is represented as D(1), and the ON time ratio for the holding control, which is represented as D(2), each need to be corrected using the equation (9). This correction enables coil current control for the operation coils 21d, 21e as appropriate corrections are made to the coil current.

More specifically, the circuit-closing-control switching correction unit 54 corrects the ON time ratio D(1) set by the circuit-closing-control ON time ratio setting unit 53 as in the equation (10) and outputs the corrected ON time ratio to the pulse generation circuit 39 as a closing control signal C.

Similarly, the holding-control switching correction unit 58 corrects the ON time ratio D(2) set by the holding-control ON time ratio setting unit 57 as in the equation (11) and outputs the corrected ON time ratio to the pulse generation circuit 39 as a holding control signal D.

[Formula 9]

$$D(1)_{CMP} = D(1) \times \left(1 + \frac{\Delta R}{R_{init}}\right) \quad (10)$$

$$D(2)_{CMP} = D(2) \times \left(1 + \frac{\Delta R}{R_{init}}\right) \quad (11)$$

The corrections performed by the circuit-closing-control switching correction unit 54 and the holding-control switching correction unit 58 enable the current driving of the operation coils, the effects of the temperature change being corrected without a temperature detecting unit detecting the temperatures of the operation coils 21d, 21e, and an optimal magnetic contactor can be achieved.

Thus, according to the embodiment described above, a coil drive circuit of a magnetic contactor is configured to perform control to set, for a switching element to switch on and off the source voltage applied to the operation coils to drive the movable iron core of the magnetic contactor, a larger ON/OFF time ratio for a circuit-closing control and a smaller ON/OFF time ratio for a holding control, and the operation of the coil drive circuit while obtaining the rate of change in the resistance of the operation coils allows an optimal coil current control is achieved for reliably performing the iron core attraction drive and the iron core holding drive without being influenced by the temperature change, to ensure the reliable operation of the magnetic contactor 10.

In addition, since the circuit-closing-control inductance calculation unit 51, the circuit-closing-control resistance value calculation unit 52, the holding-control inductance calculation unit 55, and the holding-control resistance value calculation unit 56 perform calculations using approximation by Fourier series expansion, the arithmetic processing circuit 25a can be implemented by using a microprocessor or the like with a low processing capacity. In addition, since calculation processes for calculating the resistance value of the operation coils are provided for both the circuit-closing control and the holding control, it is possible to observe changes in the resistance of the operation coil in a process to the holding control and at the same time it is possible to obtain accurate resistance values of the operation coils even when the inductance of the operation coils changes between the circuit-closing control period and the holding control period due to the structure of the contactor, which enables accurate calculations of coil resistance changes and an appropriate current control in response to the changes in the temperature of the operation coils.

It should be noted that the present invention is not limited to the above-described embodiment but various modifications are possible. For example, the semiconductor switching element 40 need not be disposed between the operation coils 21d, 21e and the negative line Ln but may be disposed between the operation coils 21d, 21e and the positive line Lp. Further, the current detection resistance element 36 and the semiconductor switching element 40 may be exchanged to connect the operation coils 21d, 21e, the semiconductor switching element 40, and the current detection resistance element 36 in series in this order between the positive line Lp and negative line Ln.

Further, in the above-described embodiment, a case has been described in which the inductance and the direct current resistance value are monitored both during the circuit-closing control and during the holding control but the present invention is not limited to this and the monitoring of the inductance and the direct current resistance value during the holding control may be omitted.

Further, in the above-described embodiment a case has been described in which the circuit-closing-control inductance calculation unit 51, the circuit-closing-control resistance value calculation unit 52, the holding-control inductance calculation unit 55, the holding-control resistance value calculation unit 56 perform calculations using approximation by Fourier series expansion but the present invention is not limited to this and calculations may be performed without using approximation but using the equation (1), the equation (3), and equations corresponding to these equations.

Further, the drive control unit 35 is not limited to a configuration with an arithmetic processing circuit 35a using a microprocessor or the like but may be configured by combining a logic circuit, a comparator, an arithmetic circuit, and the like.

Further, the structure of the magnetic contactor 10 is not limited to the structure as illustrated in FIG. 1 and FIG. 2 but the present invention may be applied to magnetic contactors having various other structures as long as the magnetic contactors have a movable contact operated by an operation coil and configured to come into contact with and separate from another contact, which is fixed.

REFERENCE SIGNS LIST

10 . . . magnetic contactor
11 . . . lower housing
12 . . . upper housing
13 . . . arc suppression cover
15A, 15B . . . fixed contact
16A, 16B . . . terminal plate
17 . . . external power supply
18 . . . load device
21 . . . electromagnet device
21a, 21b . . . fixed iron core
21c . . . coil holder
21d, 21e . . . operation coil
21f . . . yoke
21g, 21h . . . magnetic pole plate
21i . . . movable iron core
22 . . . movable contact mechanism
23 . . . contact support
24 . . . connecting member
25 . . . movable contact holder
26 . . . movable contact
27 . . . contact pressure spring
28 . . . return spring
30 . . . operation coil drive device
31 . . . coil power supply
32 . . . operation switch
33 . . . rectifying circuit
34 . . . input voltage detection circuit
35 . . . drive control unit
35a . . . arithmetic processing circuit
35b, 35c . . . analogue-digital converter (ADC)
35d . . . first timer
35e . . . second timer
35f . . . non-volatile memory
36 . . . current detection resistance element
37 . . . coil voltage processing circuit
38 . . . coil current processing circuit
39 . . . pulse generation circuit
40 . . . semiconductor switching element
51 . . . circuit-closing-control inductance calculation unit
52 . . . circuit-closing-control resistance value calculation unit
53 . . . circuit-closing-control ON time ratio setting unit
54 . . . circuit-closing-control switching correction unit
55 . . . holding-control inductance calculation unit
56 . . . holding-control resistance value calculation unit
57 . . . holding-control ON time ratio setting unit
58 . . . holding-control switching correction unit

The invention claimed is:
1. An operation coil drive device for a magnetic contactor, the device comprising:
a magnetic contactor configured to apply by switching control a source voltage to an operation coil wound around a fixed iron core to attract a movable iron core;
a current detection unit configured to detect a current allowed to pass by the switching control through the operation coil;
a coil voltage detection unit configured to detect a voltage across the operation coil during the switching control; and
a drive control unit configured to perform control to set, for a semiconductor switching element to switch on and off the source voltage applied to the operation coil, a larger ON/OFF time ratio for a circuit-closing control and a smaller ON/OFF time ratio for a holding control, wherein the drive control unit includes:
- a circuit-closing-control inductance calculation unit configured to calculate an inductance of the operation coil at a sampling timing of a coil current passing through the operation coil immediately after a start of the circuit-closing control;
- a circuit-closing-control resistance value calculation unit configured to calculate a direct current resistance value of the operation coil based on a result of calculation by the circuit-closing-control inductance calculation unit; and
- a circuit-closing-control switching correction unit configured to correct the ON/OFF time ratio of the semiconductor switching element for the circuit-closing control based on a result of calculation by the circuit-closing-control resistance value calculation unit.

2. The operation coil drive device for a magnetic contactor according to claim 1, wherein at least one of the circuit-closing-control inductance calculation unit and the circuit-closing-control resistance value calculation unit performs a calculation according to an approximation formula obtained by applying Fourier series expansion to an exponential function based on natural logarithm in a relational expression among the current passing through the operation coil, the voltage across the operation coil and the direct current resistance value of the operation coil, and the inductance during the circuit-closing control.

3. The operation coil drive device for a magnetic contactor according to claim 1, wherein the circuit-closing-control switching correction unit calculates a correction factor for an ON/OFF time ratio for the circuit-closing control, set at factory shipment, of the semiconductor switching element to drive the operation coil, based on a change in the direct current resistance of the operation coil during the circuit-closing control relative to a factory shipment value of direct current resistance value of the operation coil.

4. The operation coil drive device for a magnetic contactor according to claim 1,
wherein the drive control unit includes:
- a holding-control inductance calculation unit configured to calculate an inductance of the operation coil at a sampling timing of a coil current passing through the operation coil in a certain cycle during the holding control;
- a holding-control resistance value calculation unit configured to calculate a direct current resistance value of the operation coil based on a result of calculation by the holding-control inductance calculation unit; and
- a holding-control switching correction unit configured to correct the ON/OFF time ratio of the semiconductor switching element for the holding control based on a result of calculation by the holding-control resistance value calculation unit.

5. The operation coil drive device for a magnetic contactor according to claim 4, wherein at least one of the holding-control inductance calculation unit and the holding-control resistance value calculation unit performs calculation according to an approximation formula obtained by applying Fourier series expansion to an exponential function based on natural logarithm in a relational expression among the current passing through the operation coil, the voltage across the operation coil and the direct current resistance value of the operation coil, and the inductance during the holding control.

6. The operation coil drive device for a magnetic contactor according to claim 4, wherein the holding-control switching correction unit calculates a correction factor for an ON/OFF time ratio for the circuit-closing control, set at factory shipment, of the semiconductor switching element to drive the operation coil, based on a change in the direct current resistance of the operation coil during the holding control relative to a factory shipment value of direct current resistance value of the operation coil.

7. The operation coil drive device for a magnetic contactor according to claim 1, wherein the circuit-closing-control inductance calculation unit is configured to calculate the inductance of the operation coil according to the formula:

$$i(n) = \frac{V_{MAG}}{R_{MAG} + R_S} \times \left[1 - \exp\left(-\frac{R_{MAG} + R_S}{L_{MAG}} \times n \times \Delta T\right)\right]$$

wherein
n is an integer value zero or greater,
i is the current through the operation coil,
$V_{MAG}$ is the voltage across the operation coil,
$L_{MAG}$ is the inductance of the operation coil,
$R_{MAG}$ is the direct current resistance value of the operation coil,
$R_S$ is a current detection resistance value, and
$\Delta T$ is the sampling time.

8. The operation coil drive device for a magnetic contactor according to claim 1, wherein the circuit-closing-control resistance value calculation unit is configured to calculate the direct current resistance value of the operation coil according to the formula:

$$i(n) \approx n \times i(1) \times \left[1 - \frac{1}{2!} \times \frac{R_{MAG} + R_S}{L_{MAG}} \times n \times \Delta T\right]$$

wherein
n is an integer value zero or greater,
i is the current through the operation coil,
$L_{MAG}$ is the inductance of the operation coil calculated by the circuit-closing-control inductance calculation unit,
$R_{MAG}$ is the direct current resistance value of the operation coil,
$R_S$ is a current detection resistance value, and
$\Delta T$ is the sampling time.

9. The operation coil drive device for a magnetic contactor according to claim 1, wherein the circuit-closing-control switching correction unit is configured to correct the ON/OFF time ratio of the semiconductor switching element for the circuit-closing control based on a difference between the direct current resistance value calculated by the circuit-closing-control resistance value calculation unit and a second resistance value of the operation coil obtained prior to the calculation of the direct current resistance value by the circuit-closing-control resistance value calculation unit.

10. The operation coil drive device for a magnetic contactor according to claim 9, wherein
the circuit-closing-control switching correction unit is configured to correct the ON/OFF time ratio of the semiconductor switching element for the circuit-closing control by multiplying the ON/OFF time ratio with a predetermined factor, and
the predetermined factor is calculated based on a result obtained by dividing the difference between the direct current resistance value and the second resistance value by the second resistance value.

11. The operation coil drive device for a magnetic contactor according to claim 1, further comprising:
a current detection resistance element; and
a semiconductor switching element, connected in series with the current detection resistance element and the operation coil,
wherein
a first end of the operation coil is connected to a positive line of a rectifying circuit and a second end of the operation coil is connected to a first end of the current detection resistance element, and
a first end of the semiconductor switching element is connected to a second end of the current detection resistance element and a second end of the semiconductor switching element is connected to a negative line of the rectifying circuit.

* * * * *